(12) United States Patent
Wei et al.

(10) Patent No.: US 6,888,392 B2
(45) Date of Patent: May 3, 2005

(54) METHOD AND RELATED CIRCUITRY FOR BUFFERING OUTPUT SIGNALS OF A CHIP WITH EVEN NUMBER DRIVING CIRCUITS

(75) Inventors: Yi-Kuang Wei, Taipei (TW); Chia-Chun Huang, Tai-Chung (TW); Chi-Ren Kuo, Tao-Yuan Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 10/249,750

(22) Filed: May 5, 2003

(65) Prior Publication Data

US 2004/0027176 A1 Feb. 12, 2004

(30) Foreign Application Priority Data

Aug. 9, 2002 (TW) .......................................... 91118040 A

(51) Int. Cl.[7] .............................. G06F 1/04; H03K 3/00
(52) U.S. Cl. ........................................ 327/295; 327/293
(58) Field of Search ................................. 327/108, 112, 327/291, 293, 295

(56) References Cited

U.S. PATENT DOCUMENTS

| 5,013,942 A | * | 5/1991 | Nishimura et al. | 327/297 |
| 5,668,484 A | * | 9/1997 | Nomura | 326/93 |
| 6,111,448 A | * | 8/2000 | Shibayama | 327/293 |

FOREIGN PATENT DOCUMENTS

JP  2001-168887  8/2001

* cited by examiner

Primary Examiner—Quan Tra
(74) Attorney, Agent, or Firm—Winston Hsu

(57) ABSTRACT

A method and related circuitry for driving output signals of a chip is disclosed. The method includes driving output signals with an even number of inverter driving circuits, and keeping an equivalent load of each inverter of the driving circuits substantially identical by keeping impedances of each driving circuit substantially identical.

15 Claims, 9 Drawing Sheets

METHOD AND RELATED CIRCUITRY FOR BUFFERING OUTPUT SIGNALS OF A CHIP WITH EVEN NUMBER DRIVING CIRCUITS

BACKGROUND OF THE INVENTION

1. Field of the Invention

The present invention provides a method and related circuit for driving a chip to output signals, and more particularly, a method and related circuit that use a plurality of inverters with equivalent loads to form an even number inverter driving circuit to drive output signals.

2. Description of the Prior Art

In modern society, microprocessor chips that process information are one of the most important hardware components for various information products. There are usually numerous logic gates in chips to perform certain functions; however, in practical circuit operation, logic gates also introduce some imperfect factors such that a signal profile of the logic circuit is not as expected. So it is one of the major topics for the modern IT industry to construct circuit design that minimizes the effect of these imperfections.

Please refer to FIG. 1A. FIG. 1A is a circuit diagram for a prior art chip 10. In the chip 10, there are three driving circuits 14A, 14B, and 14C connected in between circuits 12 and 16. Signals output from an output end co of the circuit 12 to the driving circuit 14A. An output signal from an output end co of the circuit 12 is an input signal sp0 of the driving circuit 14A. There is one input end i1 and one output end o1 in the driving circuit 14A, one input end i2 and four output ends o2 in the driving circuit 14B, and four input ends i3 and 16 output ends o3 in the driving circuit 14C. The driving circuits 14A to 14C all use inverters M as a driving unit to drive signals. There is one inverter M in the driving circuit 14A, its input connects to the input end i1 of the driving circuit 14A, and the output end of the inverter M is connected to the output end o1 of the driving circuit 14B. In order to match all output ends o2 of the driving circuit 14B, there are also four inverters M in the driving circuit 14B, their output ends connect to various output ends o2 respectively, and the output ends of the inverters are connected to the input end i2. Similarly, in order to match the output ends o3 of the driving circuits a 14C, there are also 16 inverters M in the driving circuit 14C, their output ends connect to input end o3 respectively. In order to match the input end i3 of the driving circuit 14C, every four input ends of the inverters are connected to the same input circuit i3, as shown in FIG. 1A. In other words, the inverter in driving circuit 14A, inverts input signal sp0 and outputs driving signal spy, which is then fanned out to four inverters of the driving circuit 14B. The two inverters of the driving circuit 14B then invert and drive driving signal sp1 into driving signals sp2, and then fan out to the four inverter groups (four inverters in each group) of the driving circuit 14C. Finally, in order to match the eight input ends o3 of the driving circuit 14C, there are also 16 corresponding driving ends d3 in the output circuit 16. The driving signal sp3 that is driven by all inverters in the driving circuit 16 is output via each driving end d3 to the output circuit 16.

However, the allocation of a plurality of inverters M in chip 10, results in signal distortion that causes duty cycle distortion of signal sp3 because of inverter M mismatch. For instance, if the channel width ratio of a p-type MOSFET and an n-type MOSFET of an inverter M is 9 $\mu$m:1 $\mu$m, and the lengths are both 0.22 $\mu$m, a CMOS mismatch in inverter M results. Suppose every driving end d3 of the circuit 16 has a input load equivalent to four inverters M (as shown in FIG. 1A, i.e. every inverter M in driving circuit 14C has to push a load that is equivalent to four inverters), the duty cycle of the input signal sp0 is 50%, but the duty cycle of signal sp3 will be distorted to 51.85%. Please refer to FIG. 1B. If the driving circuit allocation between the circuits 12 and 16 changes to two levels 17A, 17B, and every driving end d3 of the circuit 16 has a load that is equivalent to 16 inverters, then the inverters of the driving circuit 17A only need to drive the load of 4 inverters in the driving circuit 17B. However, each inverter in the driving circuit 17B has to drive the load of 16 inverters. Under such a mismatched load, if a signal sp0 has a duty cycle of 50%, the duty cycle of the signal sp3 will be seriously distorted to 63.25%.

The reason that the prior art inverter allocation causes duty cycle distortion is discussed as follows. Please refer to FIG. 2. FIG. 2 is a typical circuit diagram of an inverter M. There is one p-type MOSFET Qp and one n-type MOSFET Qn in the inverter M, which function as a current source and a current sink respectively. Gate ends of the transistors Qp, Qn are electrically connected to an input end i0 of the inverter, and sources of the transistors Qp, Qn are electrically connected to a DC bias supply Vd and ground G respectively. Drains of the transistors Qp, Qn are electrically connected to a node Nop, which becomes the output end of inverter M. The circuit that the output end of inverter M connects to has an equivalent input impedance that is the equivalent load Zp0 of the inverter M. In a logic circuit, output ends of the inverter M are usually connected to another logic gate, so the equivalent load of the inverter M can be viewed as a capacitance. When the signal voltage level of the input end i0 of the inverter M is at a low level, the transistor Qn will conduct and provide charge current to charge the equivalent load Zp0 and raise the voltage level of the node Nop. Relatively, when the voltage level of the input end i0 of the inverter M is at a high level, the transistor Qp will conduct and absorb charge current from Nop to discharge the equivalent load Zp0, making the voltage level of the node Nop drop. Hence, the signal driving power of the inverter M depends on the amount of charge and discharge current that can be conducted by transistors Qp, Qn.

As described, because inverters provide the signal driving capability of the driving circuits 14A to 14C, the waveform of the driving signal depends on the inverter M. Please refer to FIG. 3A (and also FIG. 2). FIG. 3A is an ideal inverter input-output waveform timing chart, where a horizontal axis of FIG. 3A is time and a vertical axis is signal voltage level. A dotted waveform 17A is an input waveform at the input end i0, and a waveform 17B is an output waveform at the node Nop. In an ideal inverter, conductivity of transistors Qp and Qn is compatible and matched (that is, the amount of charge and discharge current is the same). So, the rise time for the output signal voltage waveform at the node Nop from a low level to a high level is the same as the fall time from the high level to the low level. As shown in FIG. 3A, at a point t0, the dotted waveform 17A at the input end i0 changes from a low level to a high level. The inverter M starts to discharge and node Nop voltage drops to the low level, and point t1 discharge finishes, as shown as waveform 17B. Similarly, at a point t2, the waveform 17A at the input end i0 changes from the low level to the high level, and the inverter M starts to charge the node Nop to raise its voltage until point t3. If the inverter M has ideal matching driving capability for charge and discharge, the duration between the points t0 to t1 is the same as t2 to t3. If the waveform of the input end i0 is a 50% duty cycle waveform (as shown in FIG. 3A), then the output driving waveform of the ideal inverter M will also have a 50% duty cycle. In other words, output voltage waveform 17B of node Nop will have consistent time periods from rising to falling and from falling to rising, that is, time period Tp0.

However, if the transistors Qn, Qp of the inverter M are not matched for charge and discharge, the waveform quality of the output waveform at the node Nop will be affected. Even with a 50% duty cycle of the input end i0 waveform, the output waveform from the node Nop cannot maintain a 50% duty cycle. Please refer to FIG. 3B regarding this imperfection (also refer to FIG. 2 and FIG. 3A). FIG. 3B is a timing chart of the input-output waveform of an imperfect inverter. A horizontal axis of FIG. 3B is time, and a vertical axis is signal voltage level. A dotted waveform 17A is the input waveform from the node Nop at the inverter input end (consistent with the waveform 17A of FIG. 3A), and a waveform 17C is the output waveform at the node Nop. A mismatched semiconductor process makes the capability of driving discharge current of the transistor Qn less than the capability of driving charge current of the transistor Qp. At a point t0, when the input waveform 17A increase from a low level to a high level, the inverter M needs more time (until a point t1b) to discharge the node Nop waveform from a high level to a low level. Relatively, when the input waveform 17A at point t2 drops from the high level to the low level, the transistor Qp with better driving capability can charge output waveform 17C from a low level to a high level in a short period (from point t2 to point t3). In this way, even with a 50% duty cycle input waveform, a period Tp1 from rising to falling of the node Nop output waveform will be greater then a period Tp2 from falling to rising, and the waveform 17C cannot maintain a 50% duty cycle. In other words, when the inverter M has mismatched transistors, the waveform of driving output for inverter M will be distorted, and cannot have the same duty cycle as the input waveform. This type of duty cycle distortion will lead to a timing error, waveform distortion in logic circuits, and even errors in circuit function.

Because of the limited precision of semiconductor processes, inverter mismatch is not impossible. Mismatch will cause waveform distortion and limit the margin of error allowed during circuit operation. In the prior art driving circuit design principles, circuit design to correct or compensate the negative effects of inverter mismatch is not taught.

SUMMARY OF THE INVENTION

It is therefore a primary objective of the claimed invention to provide a method and related circuit that can compensate waveform (or duty cycle) distortion caused by semiconductor process imperfection when making inverters.

The principle revealed by the claimed invention is to use an even number of inverter driving circuits to produce driving signals, the equivalent load of every inverter remaining the same. In this way, the driving capability difference caused by inverter mismatch can be compensated and corrected through circuit design.

These and other objectives of the claimed invention will no doubt become obvious to those of ordinary skill in the art after reading the following detailed description of the preferred embodiment that is illustrated in the various figures and drawings.

DETAILED DESCRIPTION

In order to compensate inverter mismatch caused by semiconductor process errors, the present invention reveals two driving circuit design principles to avoid waveform duty cycle distortion caused by inverter mismatch. First, the present invention uses an even number of inverter driving circuits to produce final driving signals level by level. And second, the present invention maintains consistency of equivalent output load for inverters in every driving circuit. To illustrate the above principles in detail, we use the following embodiment as an example.

Figure 4:
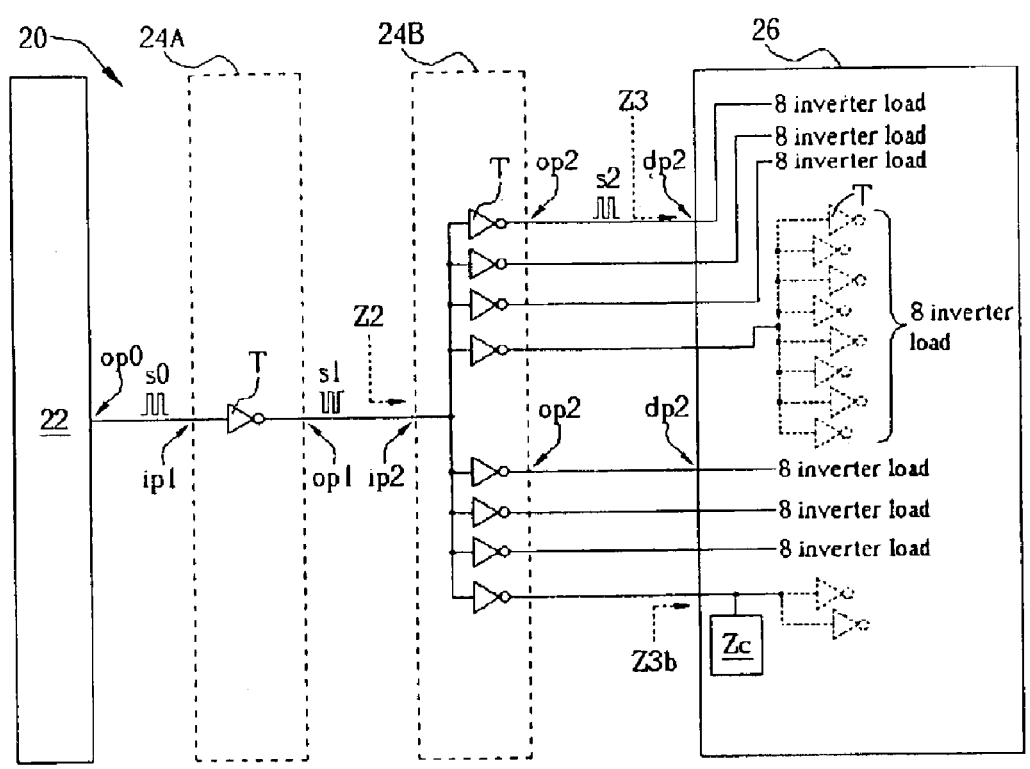
FIG. 4 is a circuit diagram of a driving circuit chip according to the present invention.

Please refer to FIG. 4. FIG. 4 is a circuit diagram of a chip 20 according to the present invention. An output signal of an output end op0 of a circuit 22 becomes an input signal s0 of a driving circuit 24A. There is one input end ip1 and an output end op1 in the driving circuit 24A, and also one inverter T as a driving unit to match the single output end op1. An input end of this inverter is connected to the input end ip1 with its output end connected to the output end op1. There is one input end ip2 and eight output ends op2 in a driving circuit 24B. Further provided are eight inverters T as driving units to match the eight output ends op2, the input ends of every inverter being connected to the input end ip2. After the driving circuit 24A receives input signal s0 from the input end ip1, a corresponding driving signal s1 will be produced and output from output end op1 to input end ip2 of the driving circuit 24B. The driving circuit 24B will then produce a driving signal s2 that corresponds to the driving signal s1, and output it to the eight output ends op2. Corresponding to the eight output ends op2, there are also eight driving ends dp2 in the output circuit 26, an equivalent load Z3 that each driving end dp2 receives is equivalent to eight inverters T. According to the design principle of the present invention as described above, two levels (i.e. an even number) of driving circuits 24A, 24B are used between circuits 22 and 26 of the chip 20. The inverters T in each driving circuit level are driving the same load. The inverter T of the driving circuit 24A is used to drive the eight inverters T in the driving circuit 24B. An input load of each driving end dp3 in the circuit 26 is equivalent to eight inverters, so each inverter T in the driving circuit 24B is used as if to drive eight inverters. By using the above allocation design, even if the CMOS inverter T itself does not match (if we use the previous data, the channel width ratio of a p-type MOSFET and an n-type MOSFET inverter T is 9 $\mu$m:1 $\mu$m, and the length both are 0.22 $\mu$m) if the duty cycle of s0 is 50%, then the duty cycle of s2 will be 50.05%. In other words, there is almost no distortion of the duty cycle. In addition, if the input impedances of the input circuit 26 on each driving end dp2 are not consistent, additional impedance can be added in the output circuit 26, so the input impedance of every driving end dp2 will remain the same. For instance, if the eighth driving end dp2 (in the bottom of FIG. 4) is connected to a circuit that is equivalent to two inverters T, we can connect additional load Zc (implemented by using a capacitor) to this driving end. Thus, the equivalent input impedance Z3b of this driving end will still be the same as eight inverters T with a parallel connection.

Figure 5:
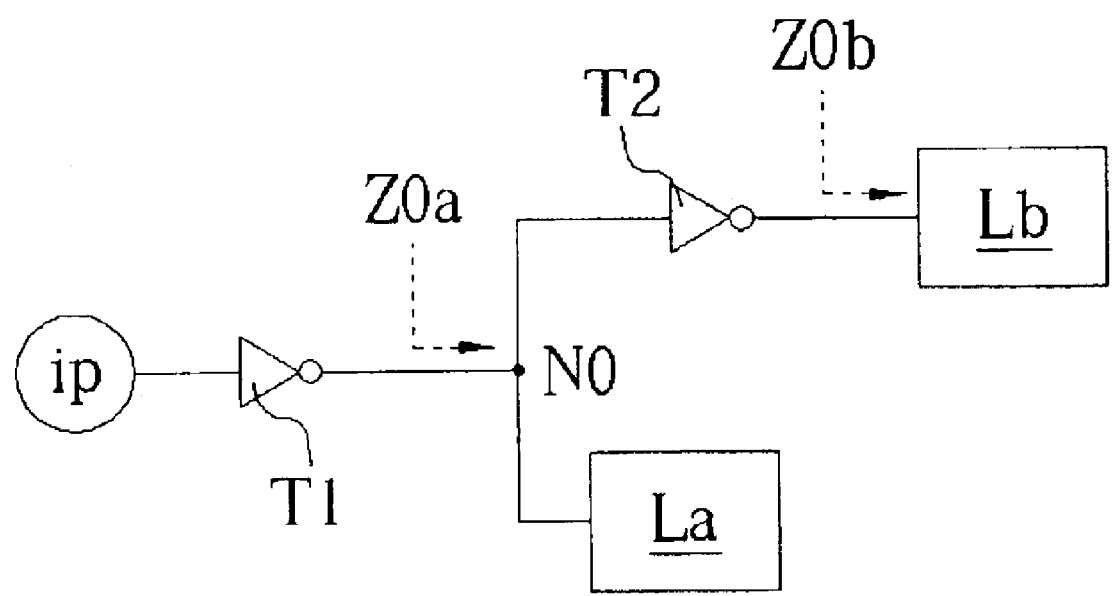
FIG. 5 is a circuit diagram of a driving circuit according to the present invention.

For a detailed discussion on the principles of the design of the present invention, please refer to FIG. 5. FIG. 5 is a typical driving circuit diagram according to the present invention. In FIG. 5, two identical inverters T1 and T2 represent a driving circuit with a two level serial connection. The inverter T1 receives a signal from an input end ip at a node n0 and drives a signal to a secondary circuit La. An input end of the inverter T2 is connected to a node N0 and an output signal to drive a secondary circuit Lb. The inverter T1 has an equivalent load Z0a on a node N0 (formed by the input impedance of the inverter T2 and circuit La), while the inverter T2 has an input impedance from a secondary circuit Lb as the equivalent load Z0b of inverter T2. If we compare the circuit in FIG. 5 to the circuit of the chip 20 in FIG. 4 (please also refer to FIG. 4), we can see that the inverter T1 is the inverter for the driving circuit 24A, the inverter T2 is a inverter for the driving circuit 24B, and the other seven inverters in the driving circuit 24B can be represented by a secondary circuit La. An input impedance Z2 supplied from the input end ip2 by the driving circuit 24B is thus equivalent to load Z0a. The secondary circuit Lb is an equivalent circuit of the input circuit 26 that is connected to one driving end, and it can provide an equivalent load Z3 (i.e. Z0b). In other words, the circuit in FIG. 5 can be used to illustrate a typical driving circuit design for the present invention.

Figure 1A:
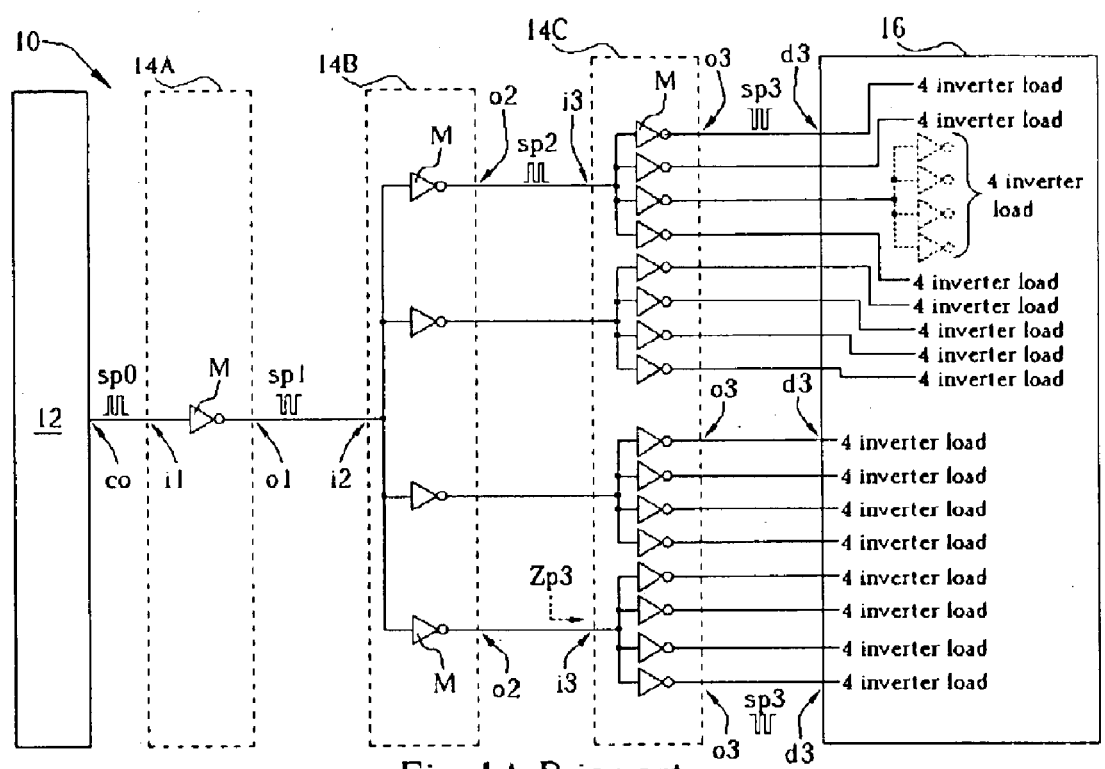
FIG. 1A and FIG. 1B are circuit diagrams of prior art chips.
Figure 1B:
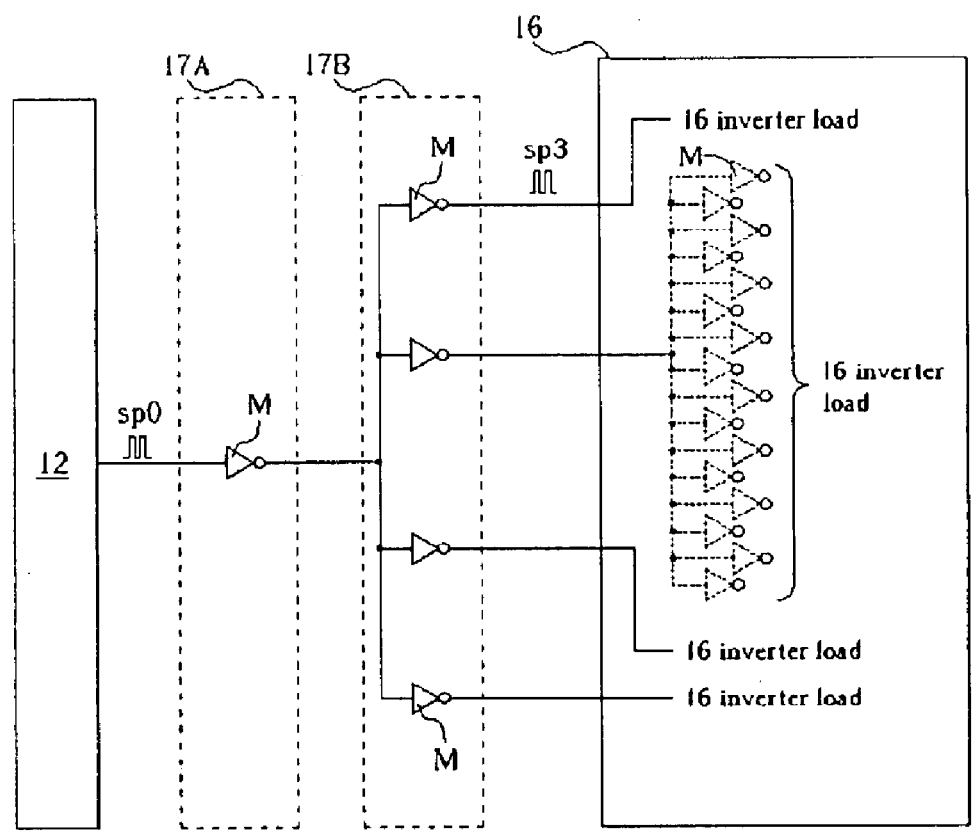
Figure 2:
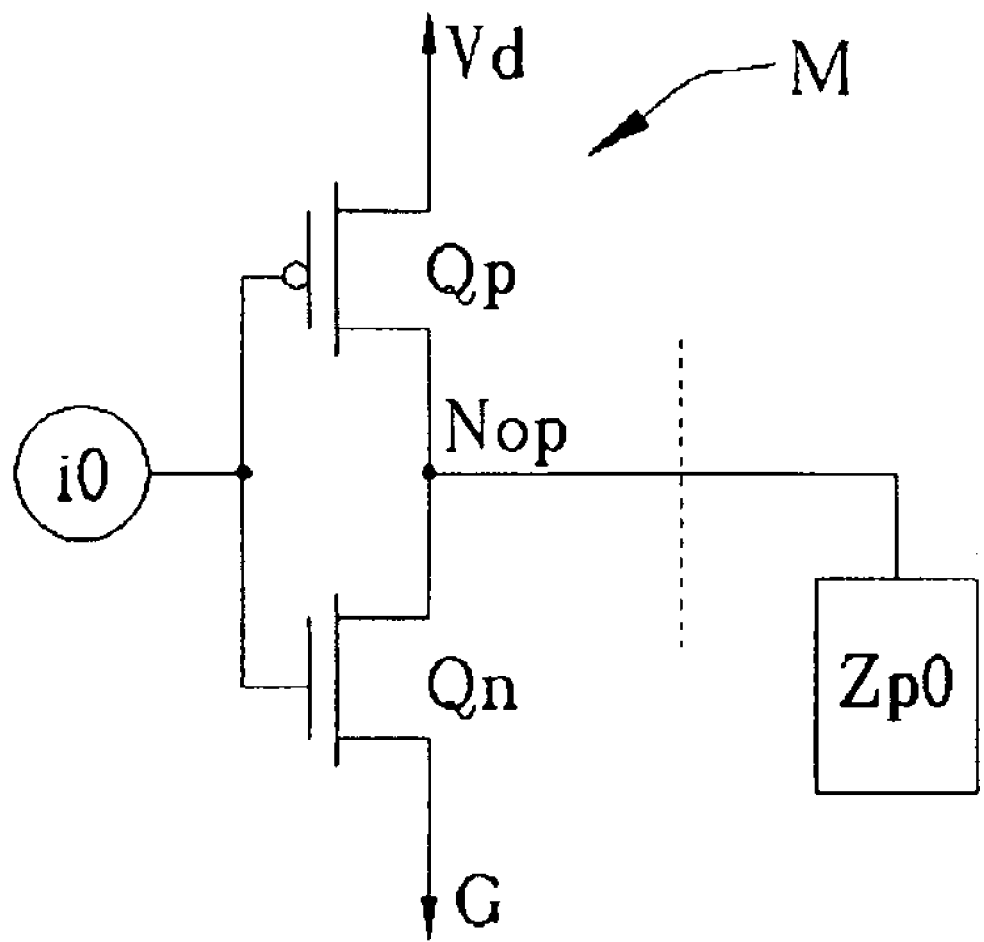
FIG. 2 is a circuit diagram of a typical inverter.
Figure 3A:
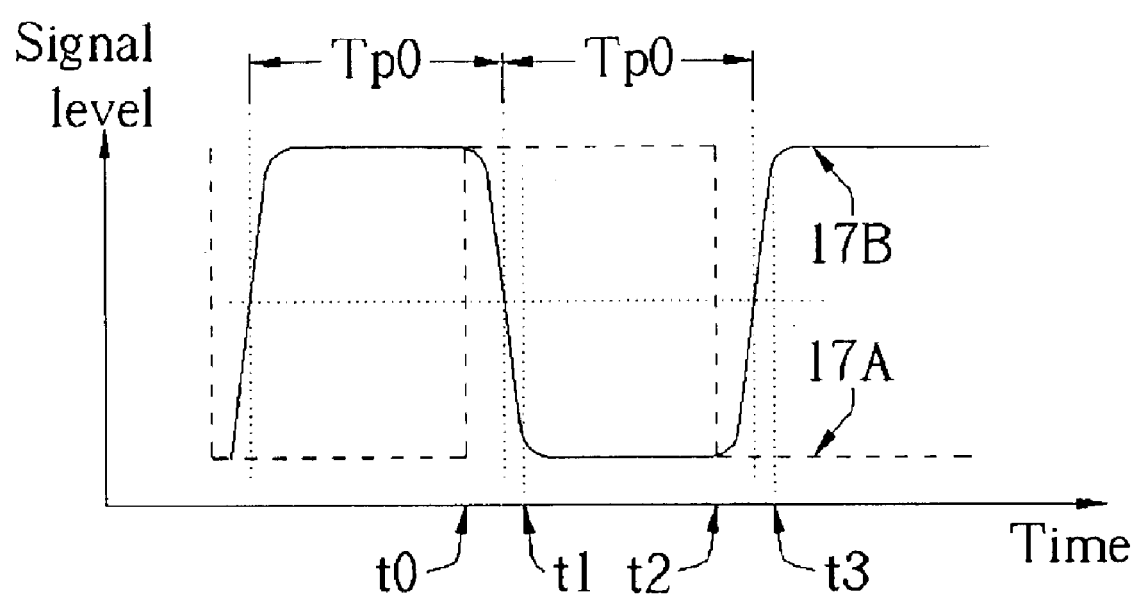
FIG. 3A is a waveform timing chart of input-output signals of an inverter under ideal conditions.
Figure 3B:
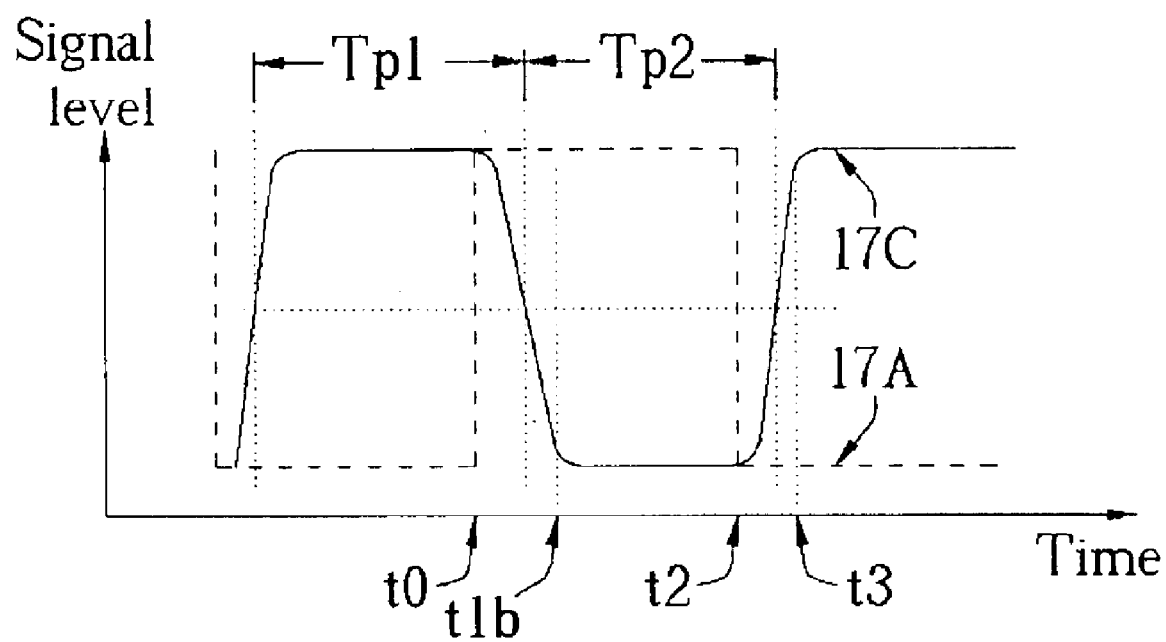
FIG. 3B is a waveform timing chart of input-output signals of the inverter of FIG. 2 under imperfect conditions.
Figure 6A:
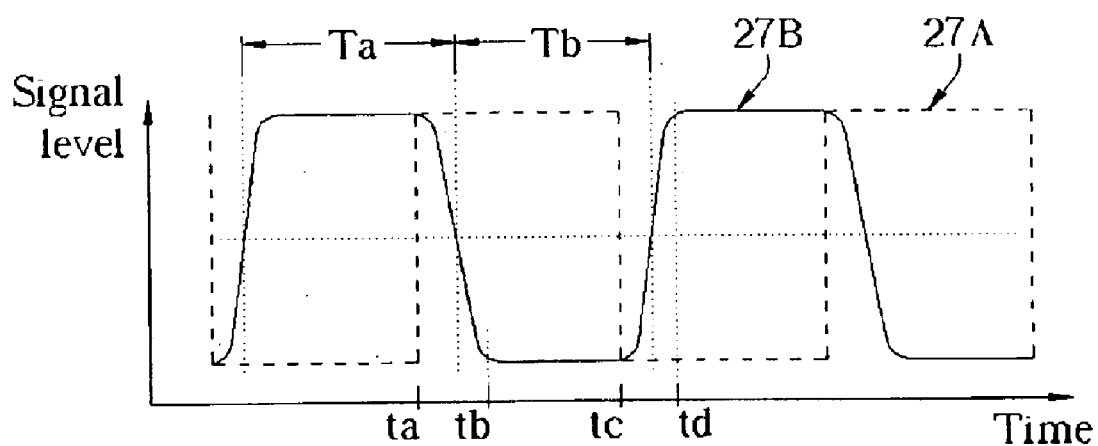
FIG. 6A and FIG. 6B are related waveform timing charts of the circuit of FIG. 5.
Figure 6B:
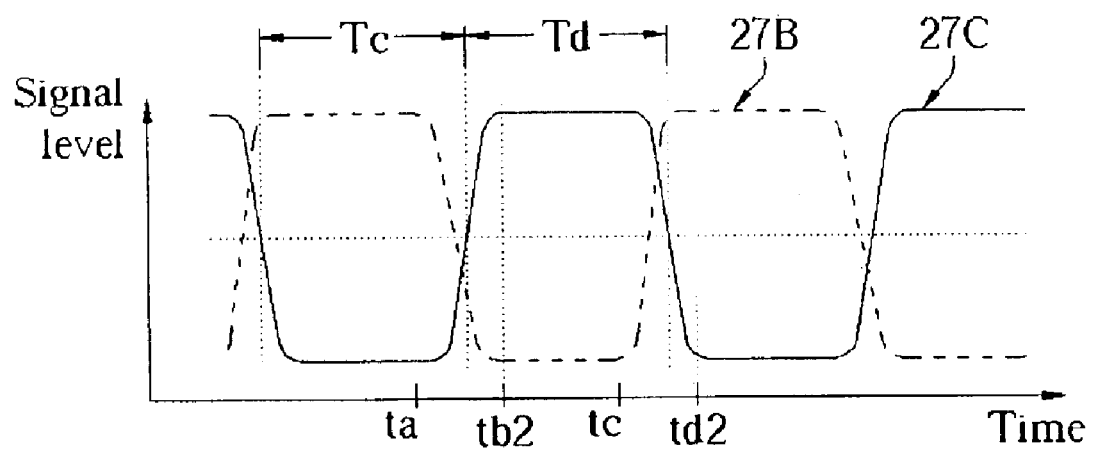

As described above, the objective of the present invention is to minimize driving signal waveform distortion caused by inverter mismatch. The principle of the present invention can be illustrated by the circuit of FIG. 5. Please refer to FIG. 6A and FIG. 6B for further information. FIG. 6A and FIG. 6B are waveform timing charts of the circuit in FIG. 5 at the input end ip, the node N0, and the inverter T2. A horizontal axis of FIG. 6A and FIG. 6B is time, and a vertical axis is signal voltage level of waveform. In FIG. 6A and FIG. 6B, a waveform 27A is the input signal waveform at the input end ip, a waveform 27B is the driving signal waveform on the node N0 from the inverter T1, and a waveform 27C is a driving signal at the inverter T2 output end to drive the secondary circuit Lb. Suppose that the inverters T1 and T2 are made with the same semiconductor process, and are influenced by the same mismatched charge and discharge capability (related information please refer to FIG. 2 and FIG. 3B and the related description). As shown in FIG. 6A, when the input signal waveform 27A at a point ta increases from a low level to a high level, because the inverter T1 has a poor discharge capability, the equivalent load Z0a at the node N0 has to wait until a point tb to drop to a low level (as shown in the waveform 27B). Relatively, because the inverter T1 has better capability to drive charge current, in a short period (points tc to td) it can charge the voltage waveform 27B of equivalent load Z0a from a low level to a high level. Because of the mismatching charge and discharge capability of the inverter T1, even with the 50% duty cycle of the input signal waveform 27A, the duty cycle of waveform 27B cannot be maintained at 50%. So, the time period Ta from rising to falling of the waveform 27B will be greater than the time period Tb from falling to rising.

Under the allocation of even numbers (inverter T2 in FIG. 5 as the second level) of driving circuits, waveform 27B of node N0 is used as the input of the inverter T2. As shown in FIG. 6B, after the inverter T2 receives the waveform 27B, it will invert and drive the equivalent load Z0b of the secondary circuit Lb and produce the driving signal of the waveform 27C. The waveform 27B will trigger the inverter T2 to start charging the equivalent load at the less steep falling near point ta. Because the inverter T2 has better charging capability due to process mismatch, between point ta and tb2 the inverter T2 has faster response (the steeper rising of the waveform 27C) to compensate the less steep edge of the waveform 27B. Similarly, when waveform 27B at point tc starts a steeper rise to trigger inverter T2, because of its mismatch the inverter T2 can only drive lower discharge current, so a less steep falling in waveform 27C is formed compensating the steeper rising of the original waveform 27B. So after being driven by two levels of inverters T1 and T2, the final waveform 27C will have a consistent time period Tc (from rising to falling) and Td (from falling to rising). If the waveform 27A from the input end ip has a 50% duty cycle, the duty cycle of the waveform 27C will be close to 50%, and further reduce the waveform distortion caused by mismatching of charge and discharge driving capability of inverters T1 and T2.

Of course, the time needed for rising (from low level to high level) and falling (from high level to low level) of a driving signal waveform is not only related to driving capability of the inverters, but also related to the equivalent load of the inverters. An inverter equivalent load with a greater capacity component will slow the voltage change driven by this inverter, so the output waveform will have more leveled rising and falling. According to the compensation principle of the present invention described above, the rising time of the driving waveform in various inverters under each level of driving circuit must be equal, and so must be the falling time, so better compensation can be achieved. If each inverter of each level driving circuit has an identical equivalent load, then the driving waveform of different inverters will have the same rising time, and the same falling time. Although the mismatch of charge and discharge capability will make the inverters have different rising and falling times, serially connected inverters in even number driving circuits can perform compensation level by level, and the final driving waveform output from the driving circuit will not have serious duty cycle distortion. The present invention even number of equivalent load driving circuit is based on this principle.

Compared to the prior art driving circuits that cannot effectively compensate inverter driving capability mismatch, the present invention reveals two principles for driving circuit design. By using an even number of driving circuits that are formed by serially connected equivalent load inverters to compensate inverter mismatch, the driving circuit can provide driving signals having less duty cycle distortion so that a chip can drive other chips accurately and coordinate operations effectively.

Described above is only the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for correcting signals of a chip, the chip comprising:

a first driving circuit including at least one first output end, each of the first output ends used for outputting a first driving signal;

a second driving circuit including at least one second input end and at least one second output end, each of the second input ends connected to the corresponding first output end respectively, the second driving circuit generating a corresponding second driving signal according to the first driving signal and outputting the second driving signals from each of the second output ends;

an output circuit including at least one driving end, each of the driving ends connected to the corresponding second output end respectively for receiving the second driving signal output from the second driving circuit;

the method comprising:

adding a load to at least one driving end of the output circuit to keep an impedance of each second input end that is in the second driving circuit and an impedance of each driving end that is in the output circuit substantially identical.

2. The method of claim 1 wherein the first driving circuit includes at least one driving unit, each of the driving units having a output end; the output end of each driving unit connects to the corresponding first output end so as to keep a signal level of the output end of each driving unit and a signal level of the first output end corresponding to the driving unit substantially identical.

3. The method of claim 2 wherein the second driving circuit includes at least one driving unit, each driving unit having an output end and an input end; the input end of each driving unit connects to the corresponding second input end respectively, and the output end of each driving unit connects to the corresponding second output end respectively, so as to keep a signal level of the input end of each driving unit and a signal level of the second input ends connected to the driving unit substantially identical, and to keep a signal level of the output end of each driving unit and a signal level of the second output ends connected to the driving unit substantially identical.

4. The method of claim 2 wherein each driving unit is an inverter.

5. The method of claim 2 wherein the chip further comprises:

an input circuit connected to the input end of each driving unit of the first driving circuit for providing an input signal to each driving unit, each driving unit of the first driving circuit generating the first driving signal according to the input signal.

6. The method of claim 1 wherein the first driving circuit further comprises a first input end for receiving an input signal and generating the first driving signal according to the input signal; wherein if a signal level of the first input end of the first driving circuit and a signal level of the second input ends of the second driving circuit are the same, a signal level of the first output end of the first driving circuit and a signal level of the second output ends of the second driving circuit are substantially identical.

7. A chip comprising:

an input circuit for providing an input signal; and a buffer circuit comprising:

a first driving circuit connected to the input circuit including at least one first output end, the first driving circuit generating a corresponding first driving signal according to the input signal and outputting the first driving signal from each of the first output ends; and a second driving circuit including at least one second input end and at least one second output end, each of the second input ends connected to the corresponding first output end respectively, the second driving circuit generating a corresponding second driving signal according to the first driving signal and outputting the second driving signal from each of the second output ends; and an output circuit including at least one driving end, each of the driving ends connected to the corresponding second output end respectively, and including at least one load connected to one driving end for matching the impedance of that driving end with the impedances of the other driving ends, the output circuit for receiving the second driving signal;

wherein an impedance of each second input end that is in the second driving circuit and an impedance of each driving end that is in the output circuit are substantially identical.

8. The chip of claim 7 wherein if a signal level of the second input ends and a signal level of the input signal are the same, a signal level of the second Output ends of the second driving circuit and a signal level of the first output ends of the first driving circuit are substantially identical.

9. The chip of claim 7 wherein the first driving circuit includes at least one driving unit, each of the driving units having a output end; the output end of each driving units connects to the corresponding first output end so as to keep a signal level of the output end of each driving unit and a signal level of the first output end corresponding to the driving unit substantially identical.

10. The chip of claim 9 wherein the second driving circuit includes at least one driving unit, each driving unit having an output end and an input end; the input end of each driving unit connects to the corresponding second input end respectively, and the output end of each driving unit connects to the corresponding second output end respectively, so as to keep a signal level of the input end of each driving unit aid a signal level of the end input ends connected to the driving unit substantially identical, and to keep a signal level of the output end of each driving unit and a signal level of the second output ends connected to the driving unit substantially identical.

11. The chip of claim 9 wherein each driving unit is an inverter.

12. The method of claim 1 wherein adding the load comprises only functionally connecting the load to a driving end, so that the load only acts to balance the impedance of the driving end.

13. The chip of claim 12 wherein the load is a capacitor.

14. The chip of claim 7 wherein the load is only functionally connected to a driving end, so that the load only acts to balance the impedance of the driving end.

15. The chip of claim 14 wherein the load is a capacitor.

* * * * *